United States Patent [19]
Cannistra et al.

[11] 4,053,792
[45] Oct. 11, 1977

[54] LOW POWER COMPLEMENTARY FIELD EFFECT TRANSISTOR (CFET) LOGIC CIRCUIT

[75] Inventors: Anthony T. Cannistra; Joseph A. Petrosky, Jr., both of Wappingers Falls, N.Y.

[73] Assignee: International Business Machines Corporation, Armonk, N.Y.

[21] Appl. No.: 483,507

[22] Filed: June 27, 1974

[51] Int. Cl.² .................. H03K 19/08; H03K 19/34
[52] U.S. Cl. ................................. 307/205; 307/215; 307/246; 307/270
[58] Field of Search ............... 307/205, 214, 215, 270, 307/246

[56] References Cited

U.S. PATENT DOCUMENTS

| | | | |
|---|---|---|---|
| 3,233,117 | 2/1966 | Rymaszewski | 307/215 |
| 3,479,523 | 11/1969 | Pleshko | 307/205 |
| 3,562,559 | 2/1971 | Rapp | 307/279 |
| 3,651,342 | 3/1972 | Dingwall | 307/215 X |
| 3,755,690 | 8/1973 | Smith | 307/205 |
| 3,875,426 | 4/1975 | Baitinger et al. | 307/205 |
| 3,911,289 | 10/1975 | Takemoto | 307/205 |

OTHER PUBLICATIONS

Lohman, "Applications of MOSFETs in Microelectronics;" *SCP and Solid State Technology* (pub.); pp. 23-29; 3/1966.

Leehan, "Low Power CMOS Off-Chip Driver--Receiver Circuitry;" *IBM Tech. Discl. Bull.;* vol. 16, No. 7, pp. 2315-2316; 12/1973.

Lowden, "Variable Argument Logic Gate Using CMOS;" *IBM Tech. Discl. Bull.;* vol. 16, No. 2, pp. 400-401; 7/1973.

Chin, "Off-Chip Data Driver;" *IBM Tech. Discl. Bull.;* vol. 16, No. 2, pp. 630-631; 7/1973.

Axelrod, "Speed-up Circuit for NOR Circuits using IGFETs;" *IBM Tech. Discl. Bull.;* vol. 7, No. 2, pp. 168-169; 7/1964.

Ruoff, "Field Effect Transistor Logic Circuits;" *IBM Tech. Discl. Bull.;* vol. 7, No. 3, pp. 265-266; 8/1964.

*Primary Examiner*—Stanley D. Miller, Jr.
*Assistant Examiner*—Larry N. Anagnos
*Attorney, Agent, or Firm*—Theodore E. Galanthay

[57] ABSTRACT

Disclosed is a logic circuit implemented in complementary field effect transistor (CFET) technology for improving the transient response of CFET circuits and providing a true DOT-OR or DOT-AND logic function. The pull-up circuit includes at least one active device and is placed either in parallel with or replaces the conventional load impedance between a source of potential and the output node.

4 Claims, 6 Drawing Figures

LOW POWER COMPLEMENTARY FIELD EFFECT TRANSISTOR (CFET) LOGIC CIRCUIT

BACKGROUND OF THE INVENTION

1. Field of the Invention

This invention relates to a low power logic circuit implementing a logical DOT function and more particularly to a pull-up circuit for complementary field effect transistor logic circuits.

2. Description of the Prior Art

Digital logic circuits such as NOR circuits are well known in the art. Typically, a NOR circuit includes a plurality of signal transistors connected in parallel between an output node and a first fixed potential, each such transistor receiving an independent input signal for turning the transistor on or off. Typically, a load impedance is placed between the output node and a second potential forming a series path between the two potential levels.

In determining the value of resistance of the load impedance, a basic conflict between performance and power dissipation arises. The load impedance should have a very high value for low power dissipation when any of the signal transistors are on. Such a high value of load resistance also helps in keeping the output node as close to the first potential level as possible. With such a high load impedance, however, an excessive amount of time is required to bring the output node to the second potential level after all the signal transistors have been turned off. Moreover, with a high load impedance, the output current available to the output terminal at said second potential level is limited. By lowering the resistance of the load impedance, the current available to the output terminal at said second potential level increases and the transient response of bringing the output node to said second potential is greatly improved. Unfortunately, this improvement goes hand in hand with increasing the power dissipated in the series path between the two potential levels. A further problem arising with the lowered load impedance is that the output node may not be brought completely to the first potential level because of the voltage divider effect between the lower load impedance and the signal transistor.

A well known technical advantage of complementary field effect transistor circuits is that power dissipation is minimized. For this reason alone, the more complex device structure and processing technologies are worth developing. Unfortunately, this very fundamental advantage of CFET circuits is undermined by a load impedance having too low a value of resistance. At the same time, too high a value of load impedance degrades performance beyond acceptable levels. In a simple CFET inverter, consisting of P and N channel FETs connected in series between first and second potential levels, an input signal is simultaneously applied to the gate electrode of both transistors. Thus, the two transistors alternate as load and signal transistors. Such a connection effectively provides a variable load impedance varying from the on and off impedances of the transistors. The output node at the common connection between the two transistors effectively receives a push-pull output dissipating very little power (no DC power) with relatively high performance. Such an arrangement, unfortunately, is not possible if a DOT-OR or DOT-AND connection is desired at the output node.

The foregoing problems with setting the value of load resistors has led to some cumbersome proposed solutions. For example, it has been suggested that the load resistors could be made discrete and off-chip to provide low valued load resistors without exceeding the heat dissipation capacity of the chip. Those skilled in the art will recognize how truly unworkable such a solution would be. Moreover, the problem of excessive power consumption, which is a significant factor in some applications, would still remain. Another proposal would replace the desired DOT-OR function with a complex logic tree to perform the same logic function. This greatly increases the number of devices required on a chip to perform the DOT-OR function.

SUMMARY OF THE INVENTION

Accordingly, it is a primary object of this invention to provide a logical DOT function for complementary field effect transistor CFET circuits.

It is another object of this invention to provide a CFET driver circuit having improved power/performance characteristics.

It is still another object of this invention to improve the transient response of a CFET driver circuit.

Lastly, it is an object of this invention to perform the above named object with minimal additional circuitry integrated on the same semiconductor substrate with other CFET circuits.

In accordance with the present invention, a pull-up circuit is provided either in parallel with or as a replacement for the load resistor. This pull-up circuit connected between the second potential level and the output node conducts greater current in the transient state bringing the output node to the second potential level much more quickly than is possible with current through only a load resistor.

In accordance with one aspect of the present invention, the pull-up circuit is placed in parallel with the load resistor. In this case the pull-up circuit conducts current only in the transient state bringing the output node to the second potential level much more quickly than is possible with current through the load resistor alone. Once the output node has been brought to the second potential level, the pull-up circuit has no further effect on the circuit. In this form, the pull-up circuit consists of two field effect transistors and a second impedance element. One of the transistors and said second impedance are used as an inverter to invert the potential at the output node and provide it to the control electrode of the pull-up transistor. The pull-up transistor, which is of opposite conductivity type from the plurality of parallel signal transistors, is connected between the second potential level and the output node.

In accordance with another aspect of the present invention, the pull-up circuit replaces the load resistor. In such a case, the pull-up transistor is placed between the second potential level and the output node and is turned on when it is desired to bring the output node to the second potential level. A number of embodiments accomplishing the desired function are illustrated.

The foregoing and other objects, features and advantages of the invention will be apparent from the following and more particular description of the preferred embodiments of the invention as illustrated in the accompanying drawings.

DESCRIPTION OF THE PREFERRED EMBODIMENTS

Figure 1:
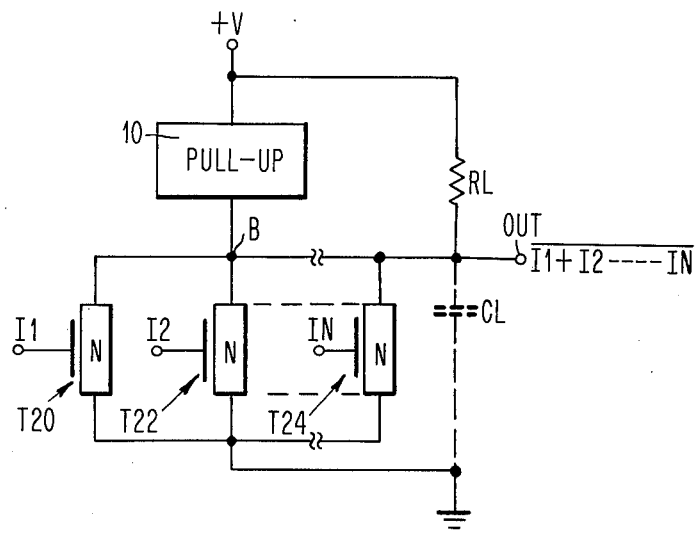
FIG. 1 is a circuit diagram of the present invention.

Refer now to FIG. 1 for a description of the complementary field effect transistor circuit of the present invention. It is noted that a DOT-OR logic function is obtained by the illustrated NOR circuit at the output node B. A plurality of N channel transistors T20, T22, and T24 are placed in parallel between a first potential (ground) and the output node B. A circuit 10 and load resistor RL are connected in parallel between the second potential (+V) and the output node B forming a series path between the two potential levels. The present invention represents improvements in the circuit 10 permitting the DOT-OR logic function at node B and generally improving the overall circuit. In accordance with the present invention, the input signal to the control electrodes of each of the N channel transistors illustrated in FIG. 1 is DOT-ORed to the output terminal providing as an output the complement of I1 or I2 or IN. As will be described in greater detail hereinbelow, the present invention also includes the elimination of load resistor RL such that circuit 10 performs the entire load function. Also, illustrated in FIG. 1 is capacitor CL connected between the output terminal and ground potential. Those skilled in the art will recognize that this represents the input capacitance of succeeding circuits as well as the inherent capacitance of the output node and does not necessarily represent a discrete capacitor.

Figure 2:
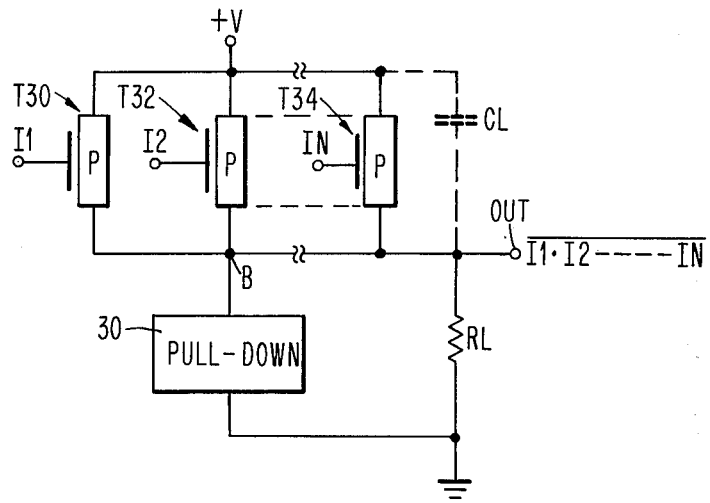
FIG. 2 is a circuit diagram of another embodiment of the present invention.

In accordance with the present invention, a DOT-NAND logic function is also possible as illustrated in FIG. 2. In FIG. 2, the P channel signal transistors T30, T32 and T34 are placed in parallel between the second potential level +V and the output node B. The load resistor RL is connected between node B and the first potential level, ground. Also connected between node B and ground in parallel with load resistor RL is circuit 30. In this embodiment, circuit 30 may be referred to as a pull-down circuit as opposed to a pull-up circuit since its function is to pull node B down to ground potential. In this case the input signals received at the various input terminals (I1, I2 and IN) are ANDed providing as an output the complement of I1 and I2 and IN.

Figure 3:
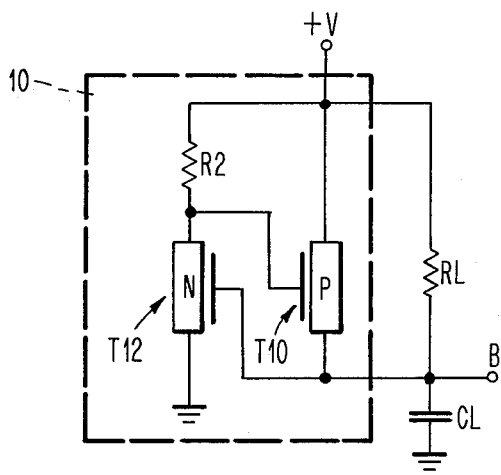
FIG. 3 is a more detailed circuit diagram of the present invention showing a portion of FIG. 1 in greater detail.

Refer now to FIG. 3 illustrating the pull-up circuit 10 of FIG. 1 in greater detail. Corresponding elements have been correspondingly designated insofar as practical. P channel pull-up transistor T10 has its drain to source path connected in parallel with resistor RL between the second potential level +V and the output node B. Resistor R2 and N channel transistor T12 are connected in series between the first and second potential levels. The control electrode of T12 is connected to the node B while the control electrode of transistor T10 is connected to the common point between transistor T12 and resistor R2. The series connection of R2 and T12 forms an inverter.

Figure 4:
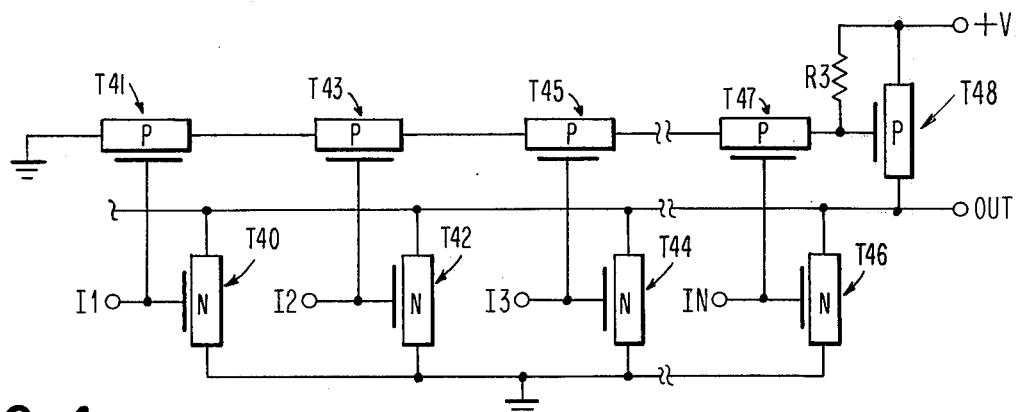
FIG. 4 is a circuit diagram of still another embodiment of the present invention.

FIG. 4 illustrates another embodiment of the present invention. Signal transistors T40, T42, T44 and T46 are connected in parallel between the output node and ground potential to provide a NOR function as previously described. The load function is performed by pull-up transistor T48 connected between the second potential (+V) and the output node. P channel transistors T41, T43, T45 and T47 are connected in series between ground potential and the control electrode of T48. Resistor R3 is connected between the +V potential and the control electrode of T48. Each of the control electrodes of transistors T41, T43, T45 and T47 receives the same input signal as is connected to the control electrode of each of the corresponding signal transistors T40, T42, T44 and T46.

Figure 5:
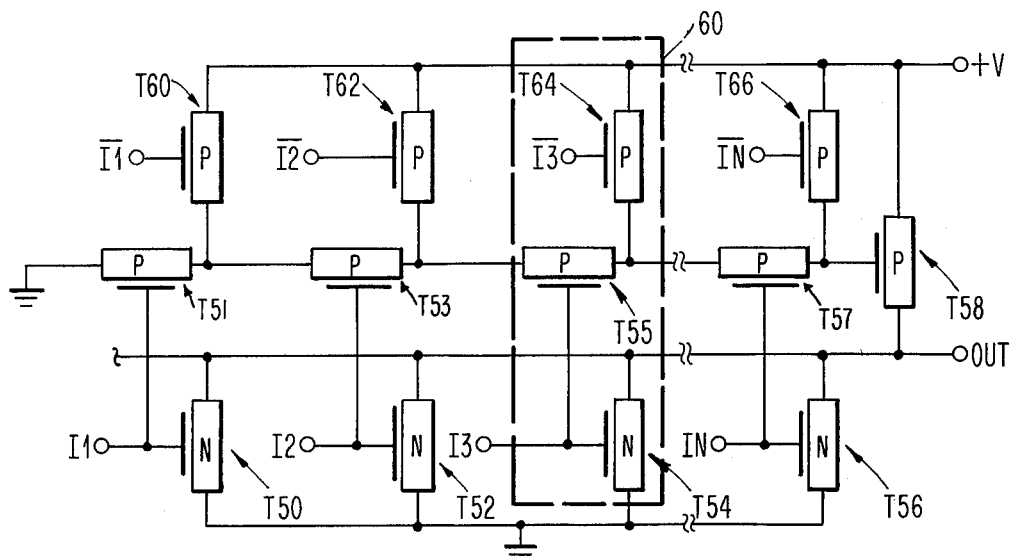
FIG. 5 is a circuit diagram of still another embodiment of the present invention.
Figure 6:
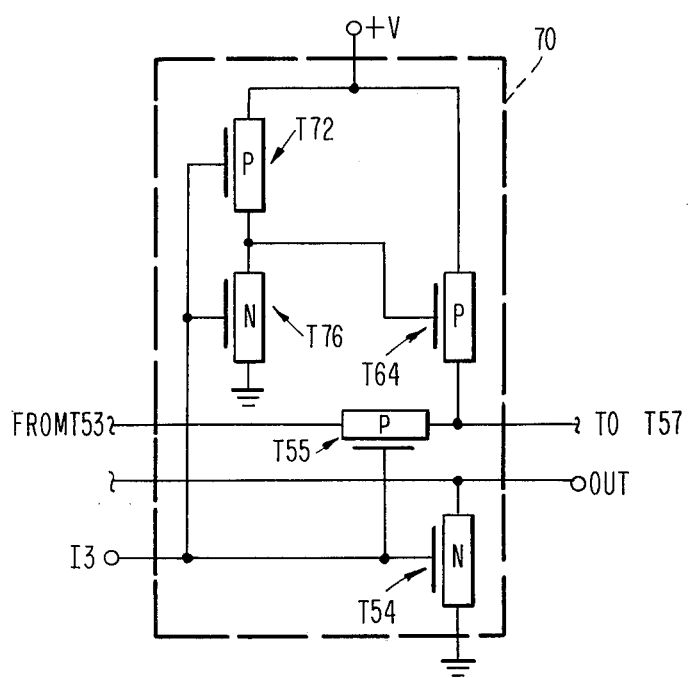
FIG. 6 is a circuit diagram of a still further embodiment of the present invention.

Refer now to FIG. 5 for a still further embodiment of the present invention. FIG. 5 again illustrates signal transistors T50, T52, T54 and T56 connected in parallel between the output node and ground potential. Each of these parallel signal transistors receives an input signal at its control electrode, the same input signal being applied to each of corresponding P channel transistors T51, T53, T55 and T57. These latter four P channel transistors are connected in series between ground potential and the control electrode of pull-up transistor T58. T58 has its drain to source electrodes connected in a series path between the second potential level (+V) and the output node. P channel transistor T60 is connected in a series path between the +V potential and a common point between transistors T51 and T53. At its control electrode, T60 receives the complement of the input signal applied to T50. P channel transistor T62 is connected between the +V potential and a common point between transistors T53 and T55. At its control electrode, T62 receives the complement of the input signal applied to the control electrode of T52. Transistor T64 is connected between the +V potential and a common point between T55 and T57 and receives at its control electrode a complement of the signal applied to the control electrode of T54. Transistor T66 is connected between the +V potential and a common point between T57 and the control electrode of T58 and has its control electrode receiving the complement input signal applied to the control electrode of T56. Each of the input signals is applied to a corresponding one of the control electrodes of T51, T53, T55 and T57 as illustrated in FIG. 5. It is noted that the addition of NOR functions requires only an additional stage such as illustrated by block 60. (The same of course can readily be ascertained by glancing at the previously described embodiments.) Accordingly, the FIG. 5 embodiment might further be modified by having a group of blocks such as illustrated by block 60 replaced by a group of blocks such as illustrated by block 70, as illustrated in FIG. 6. The primary distinction between FIG. 6 and FIG. 5 is that the complement of the input I3 does not have to be generated separately for application to the control electrode of T64. Rather, the input signal I3 is inverted by the series connection of P channel transistor 72 and N channel transistor 76. These latter two transistors are connected in series between the first and second potential levels and have the common connection therebetween connected to the control electrode of P channel transistor T64 providing the desired invert function.

Although the foregoing circuits have been shown with a particular relationship between the P and N channel transistors used in CFET technology, those skilled in the art will recognize that each of the illustrated circuits has a dual circuit in which the roles of P channel and N channel transistors as well as the applied potential levels and input signals are reversed to perform the desired functions. Those skilled in the art will recognize that such dual circuits are equivalents of the present invention.

OPERATION

Refer again to FIG. 1 which describes the DOT function generating a NOR output of inputs I1 through IN. If any input I1 through IN is at an up level (+V being designated a binary 1, that its corresponding signal transistor T20 through T24 respectively, will be turned on. The parallel impedance of pull-up circuit 10 and impedance RL must be sufficiently high that even if only one of the signal transistors is on, node B (including the entire output buss) be held at a binary down level (binary 0). With continued reference to FIG. 1, refer also to FIG. 3 which shows the details of pull-up circuit 10. It is here noted that node B is also connected to the gate electrode of N channel transistor T12 so that node B must also be held below the threshold level of T12 (approximately +2 volts, for example). Thus, T12 is maintained off permitting the gate electrode of T10 to be charged to an up level through R2 keeping T10 also off. Accordingly, the circuit 10 should present an infinite impedance when B is at a down level such that RL acts as the only load impedance in the steady state when node B is at a down level. It is again pointed out that in this condition any one of the signal transistors must be sufficiently large to maintain node B at a true down level.

When all the signal transistors T20, T22 and T24 are turned off by down level signals at their inputs, node B begins to rise due to current from +V through RL. As soon as node B is charged in excess of the threshold level of T12, this N channel transistor begins to conduct bringing the control electrode of T10 to a down level turning T10 on permitting node B to be charged much faster through T10. Once node B is fully charged to an up level, the source and drain electrodes of T10 are brought to approximately the same potential so that this P channel transistor no longer conducts current. T12 is still on at this point requiring series resistor R2 to limit the current flow between the two potential levels. It is in this upgoing transient state that the pull-up circuit of FIG. 3 has its greatest use. In the down going transition, as one of the signal transistors is turned on, node B is pulled to ground turning off transistor T12 which in turn prevents T10 from conducting current.

It is noted that the foregoing circuit has the benefits of providing a DOT-OR function and greatly improved performance by use of the pull-up circuit. A disadvantage of the just described circuit is that DC power is dissipated through impedance RL and impedance R2. A DOT-AND function can be performed in the same general manner as just described by the circuit of FIG. 2. In FIG. 2, the parallel signal transistors T30 through T34 are P channel transistors. The pull-down circuit 30 is appropriately modified to perform the identical function as circuit 10 in FIG. 3. FIG. 2 exhibits the same performance improvement as well as the undesirable added power dissipation as is found in the circuit combination of FIGS. 1 and 3.

In order to dissipate less DC power, the DOT function generating a NOR output (DOT-NOR) is provided by the circuit of FIG. 4. When the input to any one of signal transistors T40, T42, T44 or T46 is at an up level keeping it on, the output node is maintained at a down level. Such an up level input signal will also maintain the corresponding one(s) of P channel transistors T41, T43, T45 and T47 off. Thus, R3 conducts no current, keeping the control electrode of P channel transistor T48 at an up level (off). If all the inputs I1 through IN are brought to a down level, all of P channel transistors T41, T43, T45 and T47 are turned on bringing the gate of pull-up transistor T48 to a down level permitting it to conduct and bring the output node to an up level. While the output node is at this up level, DC power is dissipated in the series path between +V and ground through resistor R3 and P channel transistors T41, T43, T45 and T47. This is a relatively high impedance such that this circuit dissipates less power. Depending on the number of stages, however, the performance of this circuit is also slower because it can take a longer time to turn T48 on to bring the output node to an up level.

In order to dissipate 0 DC power but with the use of additional active devices, the circuits of FIGS. 5 and 6 are provided. In FIG. 5, if any one of signal transistors T50, T52, T54 or T56 are on, the output node is maintained at a down level. Such an up level input signal will also keep the corresponding one of P channel transistors T51, T53, T55 and T57 off. The complement of the input signal will turn on the corresponding one of transistors T60, T62, T64 or T66. Thus, the control electrode of T58 will be at an up level. As all of the signal transistors T50, T52, T54 and T56 are turned off by down level input signals, all of the P channel transistors T51, T53, T55 and T57 are turned on bringing the control electrode of T58 to a down level. Simultaneously, all of P channel transistors T60, T62, T64 and T66 are turned off by the complement of the input signals. Thus, T58 is turned on bringing the output node to an up level.

In order to eliminate the need for a separate complemented input as required in FIG. 5, the circuit of FIG. 6 is provided. The complemented input is generated on chip by the inverter consisting of series transistors 72 and 76. When the control electrodes of these inverter transistors receive an up level signal, N channel transistor 76 is turned on. Coversely when the control elecrodes receive a down level signal, P channel transistor 72 is turned on. Thus, DC current cannot flow except perhaps momentarily during the transition, if one of the two transistors begins to turn on before the other one has fully turned off. Thus, in exchange for the space required by two minimum area devices T72 and T76 and in exchange for a possibly slight momentary DC power dissipation, the need for a complemented input is eliminated.

While the invention has been particularly shown and described with reference to preferred embodiments thereof, it will be understood by those skilled in the art that various changes in form and detail may be made therein without departing from the spirit and scope of the invention.

What is claimed is:

1. A complementary field effect transistor logic circuit comprising:
   an output node;
   a first plurality of transistors of a first channel type connected in parallel between a first potential level and said output node, each said transistor receiving an input signal at a control electrode;
   a pull-up transistor of a second channel type connected between said output node and a second potential level;

impedance means connected between said second potential level and a control electrode of said pull-up transistor; and a second plurality of transistors of said second channel type connected in electrical series between said first potential level and the control electrode of said pull-up transistor, each said second plurality of transistors having a control electrode receiving an input corresponding to each of the inputs received by said first plurality of transistors.

2. A complementary field effect transistor logic circuit comprising:

an output node;

a first plurality of transistors of a first channel type connected in parallel between a first potential level and said output node, a control electrode of each said first plurality of transistors receiving an input signal;

a pull-up transistor of a second channel type connected between said output node and said second potential level;

a second plurality of field effect transistors of said second channel type connected between said first potential level and a control electrode of said pull-up transistor, each said second plurality of transistors receiving an input signal at its control electrode corresponding to an input signal received by each said plurality of transistors of said first channel type; and a third plurality of transistors of said second channel type connected between said second potential level and a current path defined by said second plurality of transistors, each said third plurality of transistors receiving at its control electrode a complemented input signal corresponding to an input signal received at the control electrode of each said first and second plurality of transistors.

3. A complementary field effect transistor logic circuit as in claim 2 further comprising:

an inverter circuit connected between the control electrode of each said first and second plurality of field effect transistors and the control electrode of each said third plurality of field effect transistors.

4. A complementary field effect transistor logic circuit as in claim 3 in which said inverter circuit comprises:

a pair of series connected field effect transistors of first and second channel type forming a series electrical path between said first and second potential levels, a common point therebetween forming an output node connected to the control electrode of each said third plurality of transistors, the gate electrodes of each said pair of transistors being connected to the control electrodes of each said first and second plurality of field effect transistors.

* * * * *